US007368945B2

(12) United States Patent
Kida et al.

(10) Patent No.: US 7,368,945 B2
(45) Date of Patent: May 6, 2008

(54) LOGIC CIRCUIT, TIMING GENERATION CIRCUIT, DISPLAY DEVICE, AND PORTABLE TERMINAL

(75) Inventors: Yoshitoshi Kida, Kanagawa (JP); Yoshiharu Nakajima, Kanagawa (JP); Toshikazu Maekawa, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 11/441,879

(22) Filed: May 26, 2006

(65) Prior Publication Data

US 2006/0214694 A1 Sep. 28, 2006

Related U.S. Application Data

(63) Continuation of application No. 10/485,374, filed as application No. PCT/JP03/06813 on May 30, 2003, now Pat. No. 7,126,376.

(30) Foreign Application Priority Data

May 31, 2002 (JP) ............................ 2002-159039

(51) Int. Cl.
*H03K 19/173* (2006.01)
*H03K 3/037* (2006.01)

(52) U.S. Cl. .......................... 326/46; 327/295; 345/99

(58) Field of Classification Search .................. 326/46; 345/99; 327/12, 218, 291, 295
See application file for complete search history.

(56) References Cited

U.S. PATENT DOCUMENTS

| | | | | |
|---|---|---|---|---|
| 5,097,147 | A * | 3/1992 | Stuebing et al. | 327/74 |
| 6,160,533 | A * | 12/2000 | Tamai et al. | 345/89 |
| 6,914,956 | B2 | 7/2005 | Kawasaki et al. | |
| 2001/0043086 | A1* | 11/2001 | Idei et al. | 327/12 |

FOREIGN PATENT DOCUMENTS

| | | |
|---|---|---|
| JP | 62-003574 | 1/1982 |
| JP | 61-260770 | 11/1986 |
| JP | 63-85599 | 4/1988 |
| JP | 01-189284 | 7/1989 |
| JP | 4-195192 | 7/1992 |
| JP | 04-195192 | 7/1992 |
| JP | 07-092934 | 4/1995 |
| JP | 2001-100712 A | 4/2001 |
| JP | 2001-265289 | 9/2001 |
| JP | 2002-116424 | 4/2002 |
| JP | 2002-246902 | 8/2002 |

* cited by examiner

*Primary Examiner*—Daniel Chang
(74) *Attorney, Agent, or Firm*—Robert J. Depke; Rockey, Depke & Lyons, LLC.

(57) ABSTRACT

When a buffer is formed by using transistors having large element characteristic variations, the deviation of the timing between the input clock pulse and the reset pulse is likely to occur. When the deviation of the timing becomes larger, a malfunction is caused to occur, and an operation margin becomes smaller with respect to the variations of the element characteristics. In a timing generation circuit, which is formed on an insulating substrate and which has two TFFs (12, 13), for generating a dot clock DCK and a horizontal clock HCK whose frequencies are different in synchronization with a master clock MCK which is input external to the substrate, separate reset pulses drst and hrst are generated at a pulse generation circuit 15 with respect to the two TFFs (12, 13), and a resetting operation is performed at separate timings. Thus, a large operation margin can be ensured even when each circuit is formed by using TFTs having large element characteristic variations and a rough process rule.

8 Claims, 8 Drawing Sheets

(PRIOR ART)

LOGIC CIRCUIT, TIMING GENERATION CIRCUIT, DISPLAY DEVICE, AND PORTABLE TERMINAL

The subject matter of application Ser. No. 10/485,374, is incorporated herein by reference. The present application is a continuation of U.S. Ser. No. 10/485,374, filed Jan. 29, 2004 now U.S. Pat. No. 7,126,376, which is a 371 U.S. National Filing Stage filing of PCT/JP03/06813 filed May 30, 2003 which claims priority to Japanese Patent Application No. JP2002-159039 filed May 31, 2002, all of which are incorporated herein by reference.

TECHNICAL FIELD

The present invention relates to a logic circuit, a timing generation circuit, a display device, and a portable terminal. More particularly, the present invention relates to a logic circuit which is formed on an insulating substrate by using transistors having large characteristic variations, a timing generation circuit using the logic circuit, a display device using the timing generation circuit as one of peripheral driving circuits, and a portable terminal having incorporated therein the display device as a screen display section.

BACKGROUND ART

A conventional example of a timing generation circuit, which is one type of logic circuit, is shown in FIG. 7. The timing generation circuit according to this conventional example is configured to have a level-shift circuit 101, and two flip-flops which are cascade-connected in sequence to the output thereof, that is, T-type flip-flops (hereinafter referred to as "TFFs") 102 and 103 in this example. The level-shift circuit 101 level-shifts (level-converts) a master clock MCK of a low voltage amplitude, which is input externally, into a master clock lsmck of a high voltage amplitude. This master clock lsmck is supplied via a buffer 104 to a circuit which operates by using the master clock lsmck as a reference.

The TFF 102 generates a dot clock DCK by frequency-dividing the master clock lsmck. This dot clock DCK is supplied via a buffer 105 to a circuit which operates by using the dot clock DCK as a reference. The TFF 103 generates a horizontal clock HCK by further frequency-dividing the dot clock DCK. This horizontal clock HCK is supplied to a circuit which operates by using the horizontal clock HCK as a reference.

The TFFs 102 and 103 are reset in accordance with a reset pulse which is given externally, for example, at a 1H (H is a horizontal period) period. Here, wiring for transmitting the reset pulse to the TFFs 102 and 103 has a wiring capacity, a transistor input capacity, and a cross capacity with the other wiring. For this reason, a configuration is adopted in which the driving capability for a load capacity is increased by using a buffer 106 having a capability enough to drive such load capacities.

In the timing generation circuit having the above-mentioned configuration, in a case where each circuit part is formed by using transistors having large characteristic variations, the deviation of timings between each input clock pulse of the TFFs 102 and 103 and the reset pulse is likely to occur. When the deviation of timings becomes larger, problems arise in that a malfunction occurs, and the operation margin becomes smaller with respect to element characteristic variations.

Here, the circuit operation of the timing generation circuit having the above-mentioned configuration will be described with reference to the timing charts in FIGS. 8A and 8B.

During the normal operation, as shown in FIG. 8A, the TFFs 102 and 103 repeat the operation of their state being inverted in synchronization with the rise of the input clock pulse, thereby generating an output pulse whose period is twice as long as that of the input clock pulse. Furthermore, when a low-level reset pulse is given, the output pulse becomes a low level as a result of being reset at the timing of the fall thereof, and the output pulse shifts to a high level at the rise timing of the first input clock pulse after the reset pulse shifts to a high level. Thereafter, the TFFs 102 and 103 continue to generate the output pulse in synchronization with the input clock pulse over the period in which the next reset pulse is given.

On the other hand, during malfunction such as the relative timing relationship between the input clock pulse and the reset pulse being deviated due to element characteristic variations, for example, as shown in FIG. 8B, when the reset pulse which occurs in a period in which the input clock pulse is at a low level during the normal operation tap (FIG. 8A) occurs in a period in which the input clock pulse is at a high level, the reset operation is continued also after the rise timing of the next input clock pulse. Consequently, a malfunction of the polarity of the output pulse after the reset occurs.

The deviation of the relative timing relationship between the input clock pulse and the reset pulse occurs from the difference in the amount of delay between the circuits which generate these pulses, that is, the level-shift circuit 101 and the TFFs 102 and 103, and the buffer 107. In a case where these circuits are formed by using Thin-Film Transistors (TFTs) having large element characteristic variations and having a rough process rule (for example, 3.5 μm), the amount of delay is large, and, in particular, the difference is likely to occur.

The present invention has been made in view of the above-described problems. An object of the present invention is to provide a logic circuit capable of ensuring a large operation margin even when it is formed by using transistors having variations in characteristics and having a rough process rule, a timing generation circuit using the logic circuit, a display device using the timing generation circuit as one of peripheral driving circuits, and a portable terminal having incorporated therein the display device as a display output section.

DISCLOSURE OF INVENTION

The logic circuit of the present invention includes a plurality of flip-flops, formed on an insulating substrate, for generating a plurality of pulse signals whose frequencies are different, in synchronization with a clock signal which is input external to the substrate; and a reset circuit, formed on the same substrate as that of the plurality of flip-flops, for separately resetting the plurality of flip-flops, which are divided into at least two systems, at different timings. An example of this logic circuit includes a timing generation circuit for generating a plurality of timing signals whose frequencies are different, in synchronization with a master clock which is input external to the substrate. This timing generation circuit is used as an applicable timing generation circuit in a display device in which the timing generation circuit for generating a plurality of timing signals whose frequencies are different, which are required to drive the display section is mounted on the same transparent insulating substrate as that of the display section. The display device using the timing generation circuit is incorporated as a screen display section thereof in a portable terminal typified by a PDA (Personal Digital Assistant) and a cellular phone.

In the logic circuit having the above-mentioned configuration, the timing generation circuit using the logic circuit, the display device using the timing generation circuit as one of peripheral driving circuits, or the portable terminal having incorporated therein the display device as a screen display section, since a configuration in which flip-flops, which are divided into at least two systems, are reset at different timings, is adopted, a resetting operation can be performed differently between a flip-flop which needs to be reset at an earlier timing and a flip-flop which needs to be reset at a timing which is delayed from the above. As a result, since the optimum reset timing can be set with respect to the respective flip-flops, a large operation margin can be ensured even when each circuit is formed by using transistors having large variations in element characteristics and having a rough process rule.

BEST MODE FOR CARRYING OUT THE INVENTION

Embodiments of the present invention will now be described below in detail with reference to the drawings.

Figure 1:
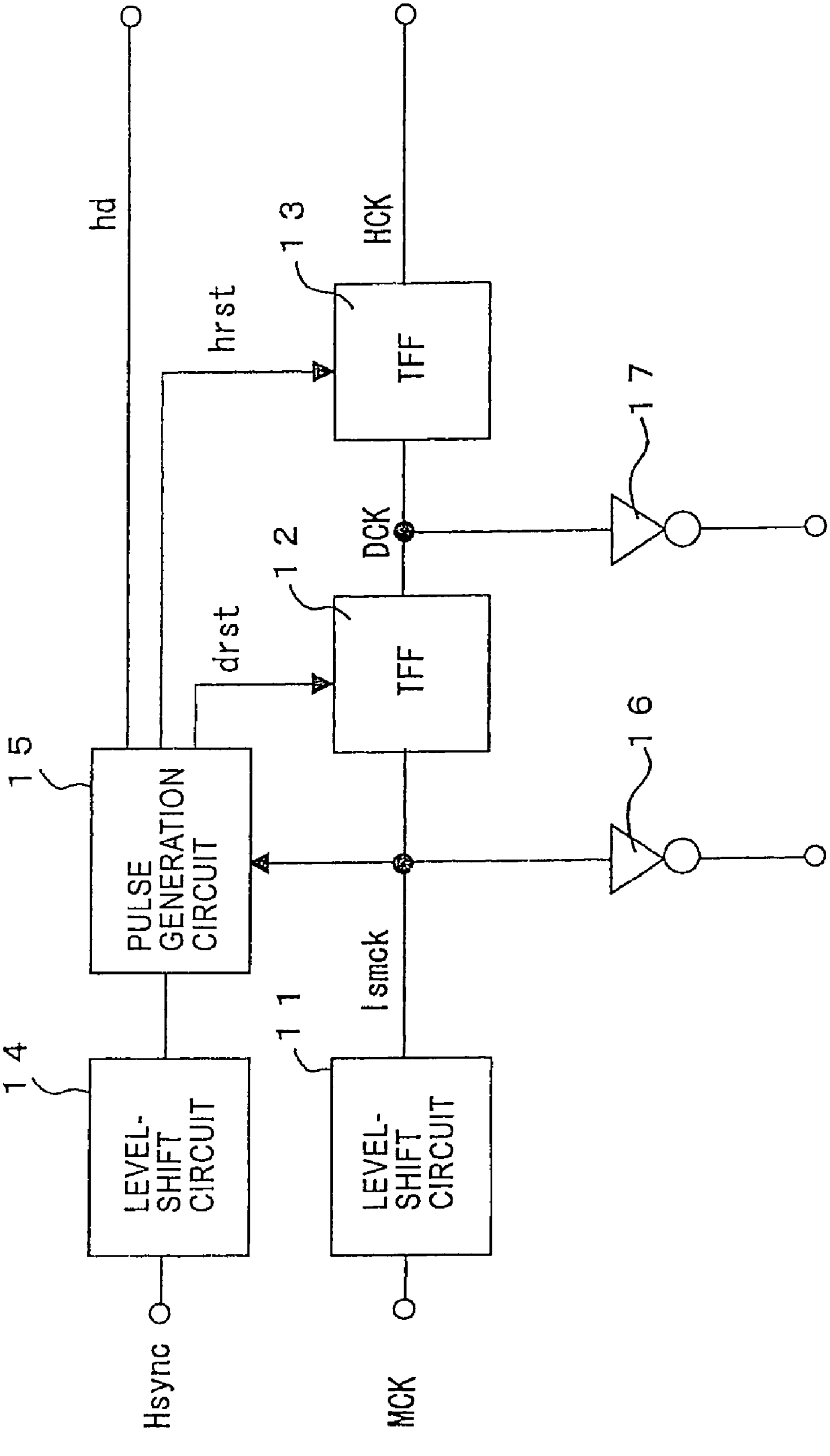
FIG. 1 is a circuit diagram showing an example of the configuration of a timing generation circuit according to an embodiment of the present invention.

FIG. 1 is a block diagram showing an example of the configuration of a logic circuit, for example, a timing generation circuit, according to an embodiment of the present invention. As is clear from FIG. 1, the timing generation circuit according to this embodiment includes, for example, a level-shift circuit 11, two flip-flops (here, TFFs) 12 and 13, a level-shift circuit 14, and a pulse generation circuit 15. It is presupposed that the timing generation circuit is formed on an insulating substrate such as a glass substrate by using transistors, for example, TFTs, having large element characteristic variations and having a rough process rule.

The level-shift circuit 11 level-shifts (level-converts) a master clock MCK of a low voltage amplitude (for example, 0 to 3.3 V), which is input externally, into a master clock lsmck of a high voltage amplitude (for example, 0 to 6.5 V). The master clock lsmck is supplied to the TFF 12 and the pulse generation circuit 15, and is supplied via a buffer 16 to a circuit which operates by using the master clock lsmck as a reference.

The TFFs 12 and 13 are cascade-connected in sequence to the output of the level-shift circuit 11. The TFF 12 generates a dot clock DCK by frequency-dividing the master clock lsmck. This dot clock DCK is supplied via a buffer 17 to a circuit which operates by using the dot clock DCK as a reference. The TFF 13 generates a horizontal clock HCK by further frequency-dividing the dot clock DCK. This horizontal clock HCK is supplied to a circuit which operates by using the horizontal clock HCK as a reference.

Here, in order that the timing of the externally input signal has a degree of freedom, that is, in order that the input timing is not determined as one type, but it is made to have latitude, the resetting operation of the TFFs 12 and 13 for generating the dot clock DCK and the horizontal clock HCK must be performed in the period of the external reference signal (in this example, the period of the horizontal synchronization signal Hsync), that is, once in one horizontal period. The present invention features a specific configuration of a reset circuit for resetting the TFFs 12 and 13. The configuration will now be described below.

The level-shift circuit 14 level-shifts a horizontal synchronization signal Hsync of a low voltage amplitude (for example, 0 to 3.3 V), which is input externally, into a high voltage amplitude (for example, 0 to 6.5 V), and supplies it to the pulse generation circuit 15. The pulse generation circuit 15 detects the edge portion of the horizontal synchronization signal Hsync after the level-shift, generates a horizontal synchronization pulse hd in the edge portion in accordance with the master clock lsmck, and further generates a plurality of reset pulses, that is, two reset pulses drst and hrst corresponding to the two TFFs 12 and 13 in this example. The reset pulse drst is used to reset the TFF 12. The reset pulse hrst is used to reset the TFF 13.

Figure 2:
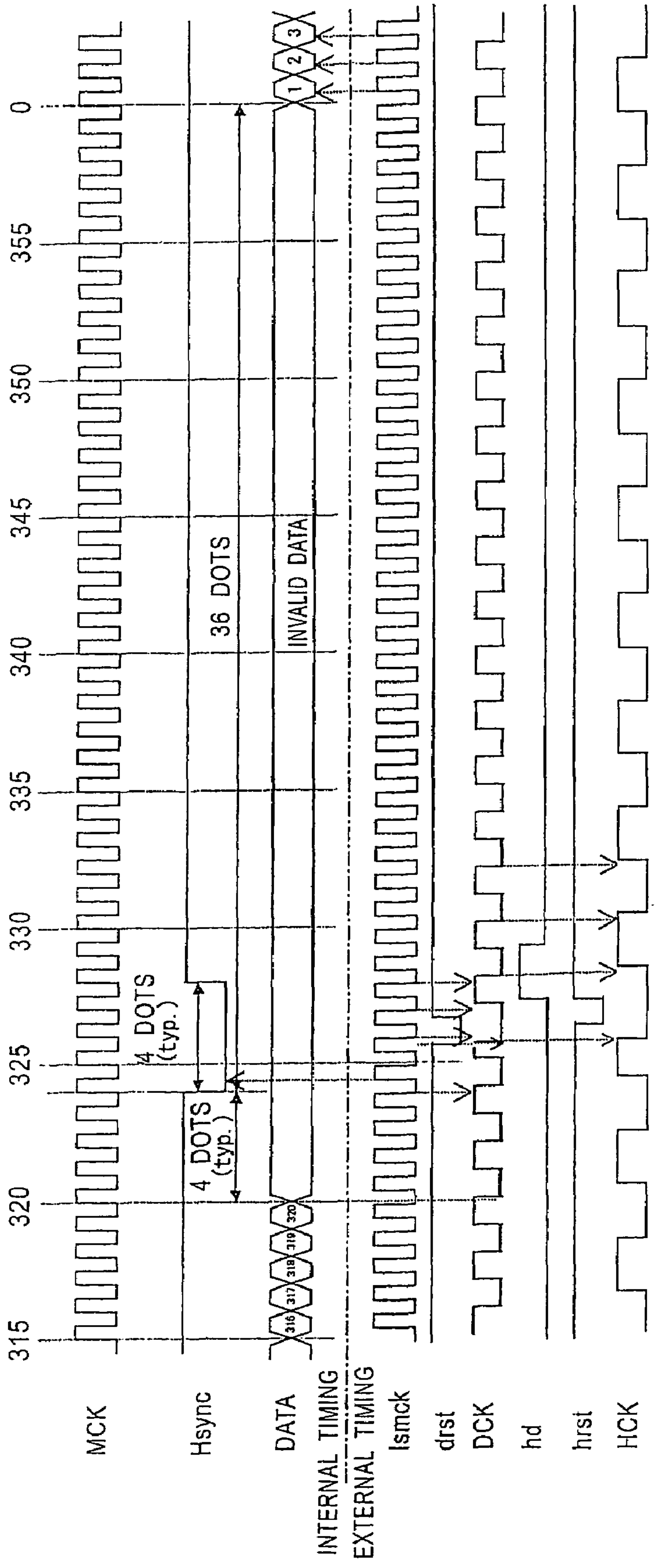
FIG. 2 is a timing chart illustrating the circuit operation of the timing generation circuit according to this embodiment.

FIG. 2 shows timing relationships among the master clock MCK and the horizontal synchronization signal Hsync, which are input externally, and the master clock lsmck, the reset pulse drst, the dot clock DCK, the horizontal synchronization pulse hd, the reset pulse hrst, the horizontal clock HCK, which are generated within this timing generation circuit. As is clear from the timing chart of FIG. 2, the reset pulse drst, the horizontal synchronization pulse hd, and the reset pulse hrst, which are generated within this timing generation circuit 15, are generated in accordance with the master clock lsmck by using the fall edge as a reference in a period in which the horizontal synchronization signal Hsync is at a low level.

In the timing generation circuit having the above-described configuration, the wiring for the reset pulses drst and hrst has a wiring capacity, a transistor input capacity, and a cross capacity with the other wiring. For this reason, a buffer becomes necessary which has a driving capability enough to drive such load capacities. As a result, due to the presence of the buffer, a delay occurs in the reset pulses drst and hrst. On the other hand, also, in the master clock lsmck, the dot clock DCK, and the horizontal clock HCK, a delay occurs because they pass through the level-shift circuit 11 and the TFFs 12 and 13.

Figure 3:
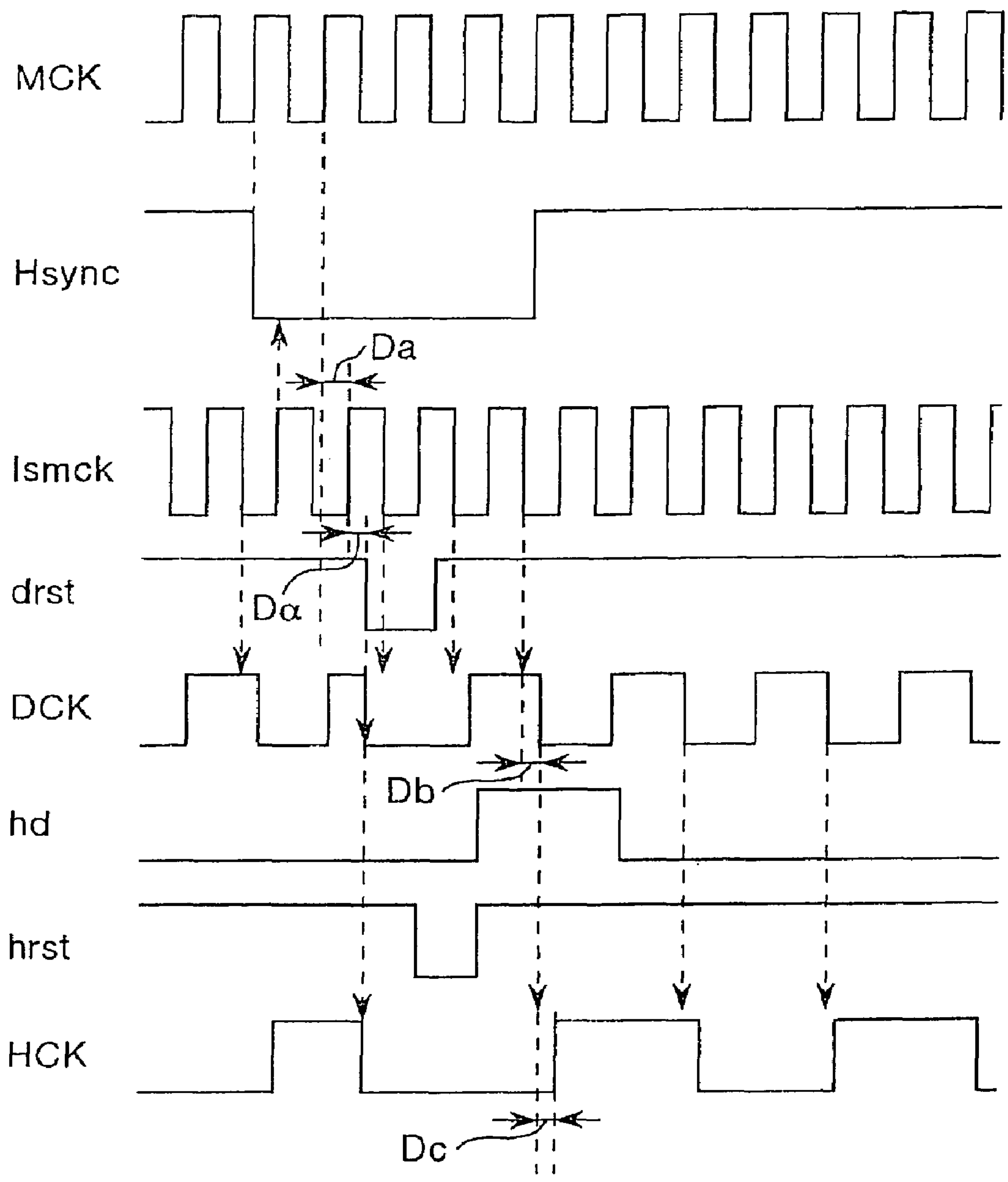
FIG. 3 is a timing chart showing in an enlarged manner the main portion of FIG. 2.

Here, the number of circuits through which the master clock lsmck passes is small, and the master clock lsmck has the smallest amount of delay. As shown in the flowchart of FIG. 3 (the enlarged view of the main portion of FIG. 2), when it is assumed that, as a result of passing through the level-shift circuit 11, an amount of delay Da occurs at the master clock lsmck with respect to the master clock MCK, if an amount of delay Db occurs at the dot clock DCK as a result of passing through the TFF 12, the amount of delay of the dot clock DCK with respect to the master clock MCK becomes Da+Db. Furthermore, if an amount of delay Dc occurs at the horizontal clock HCK as a result of passing through the TFF 13, the amount of delay of the horizontal clock HCK with respect to the master clock MCK becomes Da+Db+Dc.

In the manner described above, since the amount of delay of the master clock lsmck is the smallest, it is necessary to reduce the amount of delay as much as possible also with regard to the reset pulse drst for resetting the TFF 12 which frequency-divides the master clock lsmck. In view of the above, in the timing generation circuit according to this embodiment, the reset pulse drst is made to be separate from the reset pulse hrst. The arrangement of the pattern of the TFF 12 with respect to the pulse generation circuit 15 is set to be nearby. As a result, it is possible to reduce the load capacity of wiring for the reset pulse drst, and a buffer having a smaller driving capability is required as a buffer for driving the load capacity. Therefore, the amount of delay of the reset pulse drst in the buffer can be reduced.

Here, as is clear from the timing chart of FIG. 3, the reset pulse drst is generated at the fall timing of the master clock lsmck in a period in which the horizontal synchronization signal Hsync is at a low level. In response to the fall of the master clock lsmck, an amount of delay Dα at the pulse generation circuit 15 occurs in the reset pulse drst. The reset pulse hrst is generated at a timing relationship which is delayed further by approximately half a clock of the master clock lsmck from the reset pulse drst.

While not being limited to the timing relationship between the master clock lsmck and the reset pulse drst, also with respect to the timing relationship between the dot clock DCK and the reset pulse hrst, since the reset pulse hrst is a pulse separate from the reset pulse drst, it is possible to adjust the amounts of delays by adding a buffer if necessary.

In the timing generation circuit according to this embodiment, as is clear from the timing charts of FIGS. 2 and 3, the TFF 12 generates the dot clock DCK as a result of its state being inverted in response to the fall timing of the master clock lsmck. Similarly, the TFF 13 generates the horizontal clock HCK as a result of its state being inverted in response to the fall timing of the dot clock DCK.

In the manner described above, in the timing generation circuit, which is formed on an insulating substrate and which has two cascade-connected TFFs 12 and 13, for generating a plurality of timing signals whose frequencies are different, that is, the dot clock DCK and the horizontal clock HCK in this example, in synchronization with the master clock MCK which is input external to the substrate, separate reset pulses drst and hrst are generated with respect to the two TFFs 12 and 13. Thus, a resetting operation can be performed differently between a flip-flop which needs to be reset at an earlier timing and a flip-flop which needs to be reset at a timing which is delayed from the above. As a result, since the optimum reset timing can be set with respect to each of the TFFs 12 and 13, a large operation margin can be ensured even when each circuit is formed by using transistors having large element characteristic variations and having a rough process rule, for example, TFTs.

Here, as is clear from the timing charts of FIGS. 2 and 3, when the delay of the timing of the reset pulse drst becomes larger, and the reset pulse drst rises in a period in which the master clock lsmck is at a low level, the dot clock DCK shifts from a low level to a high level at the fall timing of the next master clock lsmck, and therefore, the polarity of the dot clock DCK after the resetting operation in accordance with the reset pulse drst is inverted.

In the above-described embodiment, the logic circuit has been described by using the timing generation circuit as an example. The present invention is not limited to the application to the timing generation circuit, and can be applied to logic circuits in general for generating a plurality of pulse signals whose frequencies are different in synchronization with a single clock signal by using a plurality of flip-flops which are cascade-connected.

A circuit configuration in which flip-flops are cascade-connected at two stages has been used as an example; applications are similarly possible to a circuit configuration in which flip-flops are cascade-connected at three or more stages so as to generate three or more pulse signals whose frequencies are different. Also, in this case, flip-flops at three or more stages may be divided into at least two systems, and may be reset separately at mutually different timings.

Furthermore, in a case where a clock having large variations in the amount of delay is put in the flip-flop, when the reset pulse is made to be a pulse having a relatively small variation in the amount of delay with respect to the input clock, the operation speed can be increased.

The timing generation circuit according to the above-described embodiment is suitably used as, for example, a timing generator for generating various timing signals which are required to drive the display section in accordance with the master clock MCK which is input external to the substrate, in a driving-circuit-integrated display device such that peripheral driving circuits are integrally formed on the same transparent insulating substrate as that of the display section having pixels arranged thereon in a matrix.

APPLICATION EXAMPLE

Figure 4:
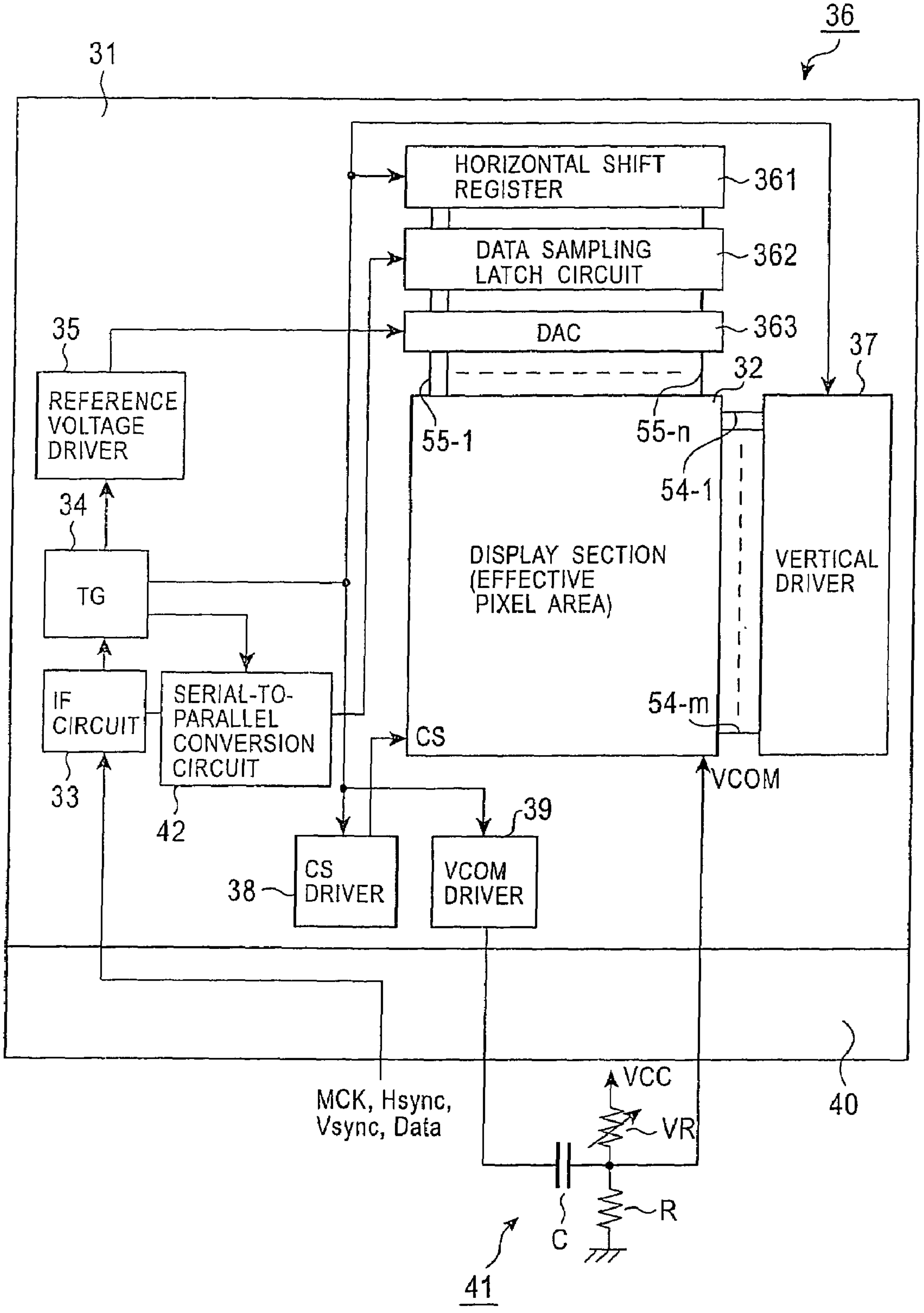
FIG. 4 is a block diagram showing an example of the configuration of a liquid-crystal display device according to the present invention.

FIG. 4 is a block diagram showing an example of the configuration of a display device, for example, a liquid-crystal display device, according to the present invention. In FIG. 4, on a transparent insulating substrate, for example, a glass substrate 31, a display section (pixel section) 32 having pixels arranged thereon in a matrix is formed. The glass substrate 31 is opposedly arranged with a predetermined spacing with another glass substrate, and a display panel (LCD panel) is formed by sealing a liquid-crystal material between the two substrates.

Figure 5:
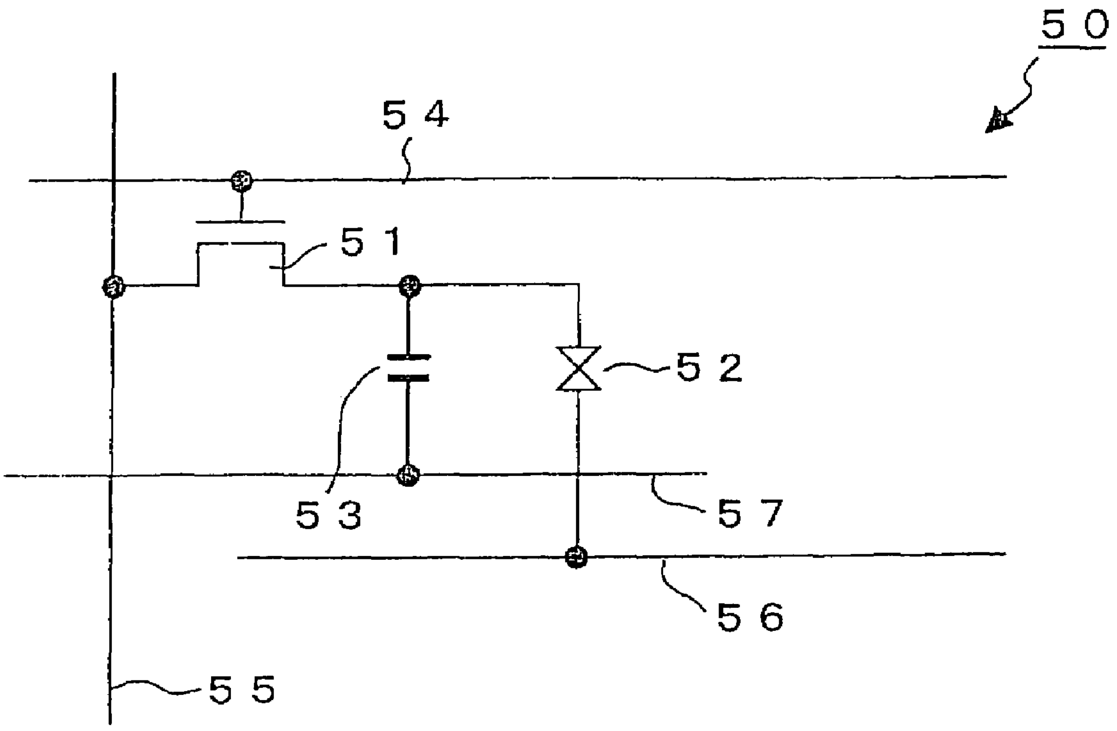
FIG. 5 is a circuit diagram showing an example of the structure of a pixel.

An example of the structure of each pixel at the display section 32 is shown in FIG. 5. Each pixel 50 arranged in a matrix is configured to have a TFT (Thin-Film Transistor) 51, which is a pixel transistor; a liquid-crystal cell 52 whose pixel electrode is connected to the drain electrode of the TFT 51; and a holding capacitor 53, one of electrodes of which is connected to the drain electrode of the TFT 51. Here, the liquid-crystal cell 52 means a liquid-crystal capacitance generated between the pixel electrode and the opposing electrode formed so as to oppose the pixel electrode.

In this pixel structure, the gate electrode of the TFT 51 is connected to a gate line (scanning line) 54, and the source electrode thereof is connected to a data line (scanning line) 55. The opposing electrode of the liquid-crystal cell 52 is connected to a VCOM line 56 in such a manner as to be common for each pixel. Then, a common voltage VCOM (VCOM potential) is supplied to the opposing electrode of the liquid-crystal cell 52 commonly for each pixel via the VCOM line 56. The other electrode (the terminal on the opposing electrode side) of the holding capacitor 53 is connected to a CS line 57 in such a manner as to be common for each pixel.

Here, in a case where 1H (H is a horizontal period) inverted driving or 1F (F is a field period) inverted driving is to be performed, the polarity of a display signal to be written into each pixel is inverted with the VCOM potential being used as a reference. Furthermore, in a case where VCOM inverted driving in which the polarity of the VCOM potential is inverted in a 1H period or a 1F period is used together with 1H inverted driving or 1F inverted driving, the polarity of the CS potential given to the CS line 57 is also inverted in synchronization with the VCOM potential. However, the liquid-crystal display device according to this embodiment is not limited to VCOM inverted driving.

Referring back to FIG. 4, on the same glass substrate 31 as that of the display section 32, for example, an interface (IF) circuit 33, a timing generator (TG) 34, and a reference voltage driver 35 are incorporated to the left of the display section 32; a horizontal driver 36 is incorporated in the upper portion of the display section 32; a vertical driver 37 is incorporated to the right of the display section 32; and a CS driver 38 and a VCOM driver 39 are incorporated in the lower portion of the display section 32. These peripheral driving circuits are manufactured by using low-temperature polysilicon or CG (continuous-grain-boundary crystal) silicon together with the pixel transistors of the display section 32.

In the liquid-crystal display device having the above-described configuration, a master clock MCK of a low voltage amplitude (for example, 3.3 V), a horizontal synchronization pulse Hsync, a vertical synchronization pulse Vsync, and display data Data of parallel input of R (red), G (green), and B (blue) are input via a flexible cable (substrate) 40 to the glass substrate 31 from outside the substrate, and the display data Data is level-shifted (level-converted) to a high voltage amplitude (for example, 6.5 V) at the IF circuit 33.

The level-shifted master clock MCK, horizontal synchronization pulse Hsync, and vertical synchronization pulse Vsync are supplied to the timing generator 34. Based on the master clock MCK, the horizontal synchronization pulse Hsync, and the vertical synchronization pulse Vsync, the timing generator 34 generates various timing pulses required to drive the reference voltage driver 35, the horizontal driver 36, the vertical driver 37, the CS driver 38, and the VCOM driver 39.

The level-shifted display data Data is supplied to a serial-to-parallel (S/P) conversion circuit 42 at the next stage. The serial-to-parallel conversion circuit 42 lowers the frequency of the display data Data to ½ by converting the display data Data into two bits for each bit in synchronization with a dot clock DCK (to be described later) supplied from the timing generator 34. The display data whose frequency is lowered at the serial-to-parallel conversion circuit 42 is lowered to a low voltage amplitude of 0 to 3.3 V, and is supplied to the horizontal driver 36.

The horizontal driver 36 is configured to have, for example, a horizontal shift register 361, a data sampling latch circuit 362, and a DA (digital-to-analog) conversion circuit (DAC) 363. The horizontal shift register 361 starts a shift operation in response to a horizontal start pulse HST supplied from the timing generator 34, and generates a sampling pulse which is transferred in sequence during one horizontal period in synchronization with a horizontal clock HCK which is similarly supplied from the timing generator 34.

The data sampling latch circuit 362 sequentially samples and latches the display data Data supplied from the interface circuit 33 via a serial-to-parallel conversion circuit 43 during one horizontal period in synchronization with the sampling pulse generated at the horizontal shift register 361. This latched digital data for one line is further transferred to a line memory (not shown) during a horizontal blanking period. Then, the digital data for one line is converted into an analog display signal at the DA conversion circuit 363.

The DA conversion circuit 363 is configured as a reference-voltage-selection-type DA conversion circuit for selecting a reference voltage corresponding to digital data from among the reference voltages for the number of gradations provided from the reference voltage driver 35 and for outputting the reference voltage as an analog display signal. The analog display signals Sig for one line, which are output from the DA conversion circuit 363, are output to data lines 55-1 to **55-*n* which are wired in such a manner as to correspond to the number of horizontal pixels n of the display section 32**.

The vertical driver 37 is formed of a vertical shift register and a gate buffer. At this vertical driver 37, the vertical shift register starts a shift operation in response to a vertical start pulse VST supplied from the timing generator 34, and generates a scanning pulse which is transferred in sequence during one vertical period in synchronization with a vertical clock pulse VCK, which is similarly supplied from the timing generator 34. The generated scanning pulses are output in sequence through the gate buffer to gate lines 54-1 to **54-*m* which are wired in such a manner as to correspond to the number of vertical pixels m of the display section 32**.

When the scanning pulses are output in sequence to the gate lines 54-1 to **54-*m* as a result of vertical scanning by the vertical driver 37, each pixel of the display section 32 is selected in sequence in units of rows (lines). Then, the analog display signals Sig for one line, which are output from the DA conversion circuit 363, are simultaneously written into the selected pixels for one line via the data lines 55-1 to 55-*n***. As a result of this writing operation in units of lines being repeated, an image display for one screen is made.

The CS driver 38 generates the above-mentioned CS potential, and provides it commonly to the pixels with respect to the other electrode of the holding capacitor 53 via the CS line 57 of FIG. 5. Here, if the amplitude of the display signal is assumed to be, for example, 0 to 3.3 V, when VCOM inverted driving is adopted, the CS potential repeats AC inversion between a low level of 0 V (ground level) and a high level of 3.3 V.

The VCOM driver 39 generates the above-mentioned VCOM potential. The VCOM potential output from the VCOM driver 39 is temporarily output outside the glass substrate 31 via a flexible cable 40. After this VCOM potential which is output outside the substrate is passed through a VCOM adjustment circuit 41, it is input again into the glass substrate 31 via the flexible cable 40, and is supplied commonly to the pixels with respect to the opposing electrode of the liquid-crystal cell 52 via the VCOM line 56 of FIG. 5.

Here, as the VCOM potential, an AC voltage having nearly the same amplitude as that of the CS potential is used. However, in practice, in FIG. 5, when a signal is written into the pixel electrode of the liquid-crystal cell 52 through the TFT 51 from the data line 54, a voltage drop occurs at the TFT 51 due to parasitic capacitance, etc. For this reason, as the VCOM potential, an AC voltage which is DC-shifted by an amount corresponding to that voltage drop needs to be used. This DC shift of the VCOM potential is burdened by the VCOM adjustment circuit 41.

The VCOM adjustment circuit 41 is formed of a capacitor C which inputs VCOM potential; a variable resistor VR which is connected between the output end of the capacitor C and an external power-supply VCC; and a resistor R which is connected between the output end of the capacitor C and a ground. The VCOM adjustment circuit 41 adjusts the DC level of the VCOM potential supplied to the opposing electrode of the liquid-crystal cell 52, that is, applies an DC offset to the VCOM potential.

In the liquid-crystal display device having the above-described configuration, on the same panel (the glass substrate 31) as that of the display section 32, in addition to the horizontal driver 36 and the vertical driver 37, peripheral driving circuits, such as the interface circuit 33, the timing generator 34, the reference voltage driver 35, the CS driver 38, and the VCOM driver 39, are integrally mounted, thereby forming a total-driving-circuit-integrated display panel. Thus, since other substrates, ICs, transistor circuits need not to be provided outside, the entire system can be reduced in size, and the cost thereof can be reduced.

In this driving-circuit-integrated liquid-crystal display device, as a timing generator 34 for generating various timing signals for driving the display section 32, the timing generation circuit according to the above-described embodiment is used. In the timing generation circuit shown in FIG. 1, the level-shift circuits 11 and 14 correspond to the interface circuit 33, and the TFFs 12 and 13, the pulse generation circuit 15, and the buffers 16 and 17 correspond to the timing generator 34.

Then, the master clock lsmck which is level-shifted at the level-shift circuit 11 is supplied to a circuit which operates by using the master clock lsmck as a reference, more specifically, the data sampling latch circuit 362 of the horizontal driver 36. Furthermore, the dot clock DCK generated at the TFF 12 is supplied to a circuit which operates by using the dot clock DCK as a reference, more specifically, the serial-to-parallel conversion circuit 42. The horizontal clock HCK generated at the TFF 13 is supplied to a circuit which operates by using the horizontal clock HCK as a reference, more specifically, the horizontal shift register 361 of the horizontal driver 36.

In the manner described above, by using the timing generation circuit according to the above-described embodiment as the timing generator 34, in the timing generation circuit, even when each circuit is formed on an insulating substrate by using transistors having large element characteristic variations and having a rough process rule, a large operation margin can be ensured. As a result, it is possible to manufacture a liquid-crystal display device having a large operation margin, which is formed in such a manner that peripheral driving circuits are formed on a transparent insulating substrate integrally with the glass substrate 31 by using TFTs.

In this application example, a case of applications to a liquid-crystal display device including liquid-crystal cells as liquid-crystal elements has been described as an example. While not being limited to this application example, applications are possible to display devices in general having mounted a level-shift circuit on the same substrate as that of the display section, such as an EL display device including EL (Electroluminescent) elements as display elements.

The display device typified by the liquid-crystal display device according to the above-described application example is suitably used as a screen display section of a small and lightweight portable terminal typified by a cellular phone and a PDA (Personal Digital Assistant).

Figure 6:
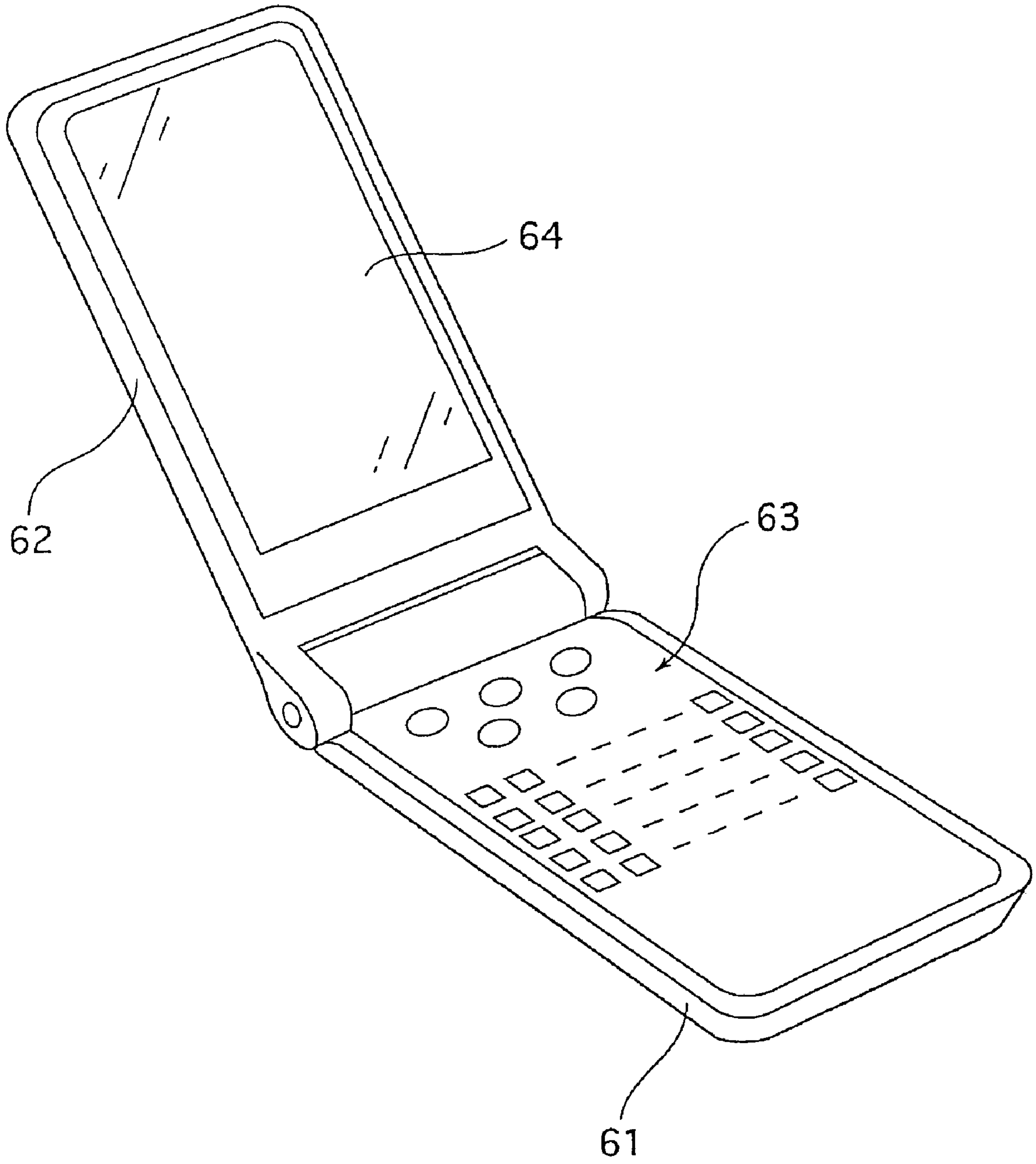
FIG. 6 is an exterior view showing the overview of the configuration of a PDA according to the present invention.
Figure 7:
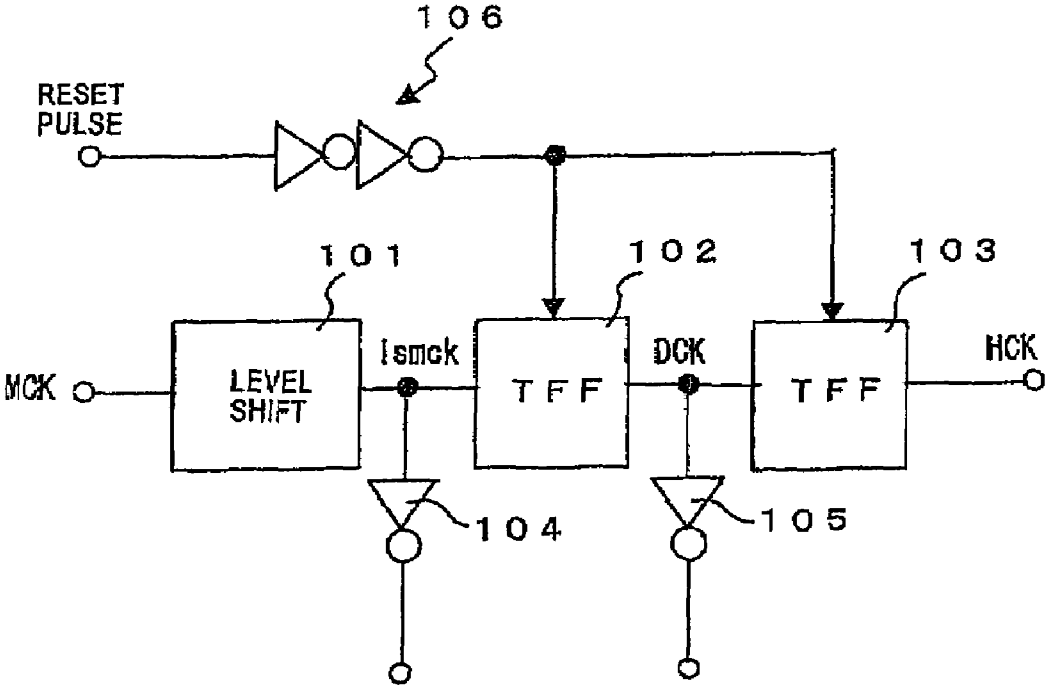
(PRIOR ART) FIG. 7
FIG. 7 is a circuit diagram showing an example of the configuration of a timing generation circuit according to a conventional example.
Figures 8A, 8B:
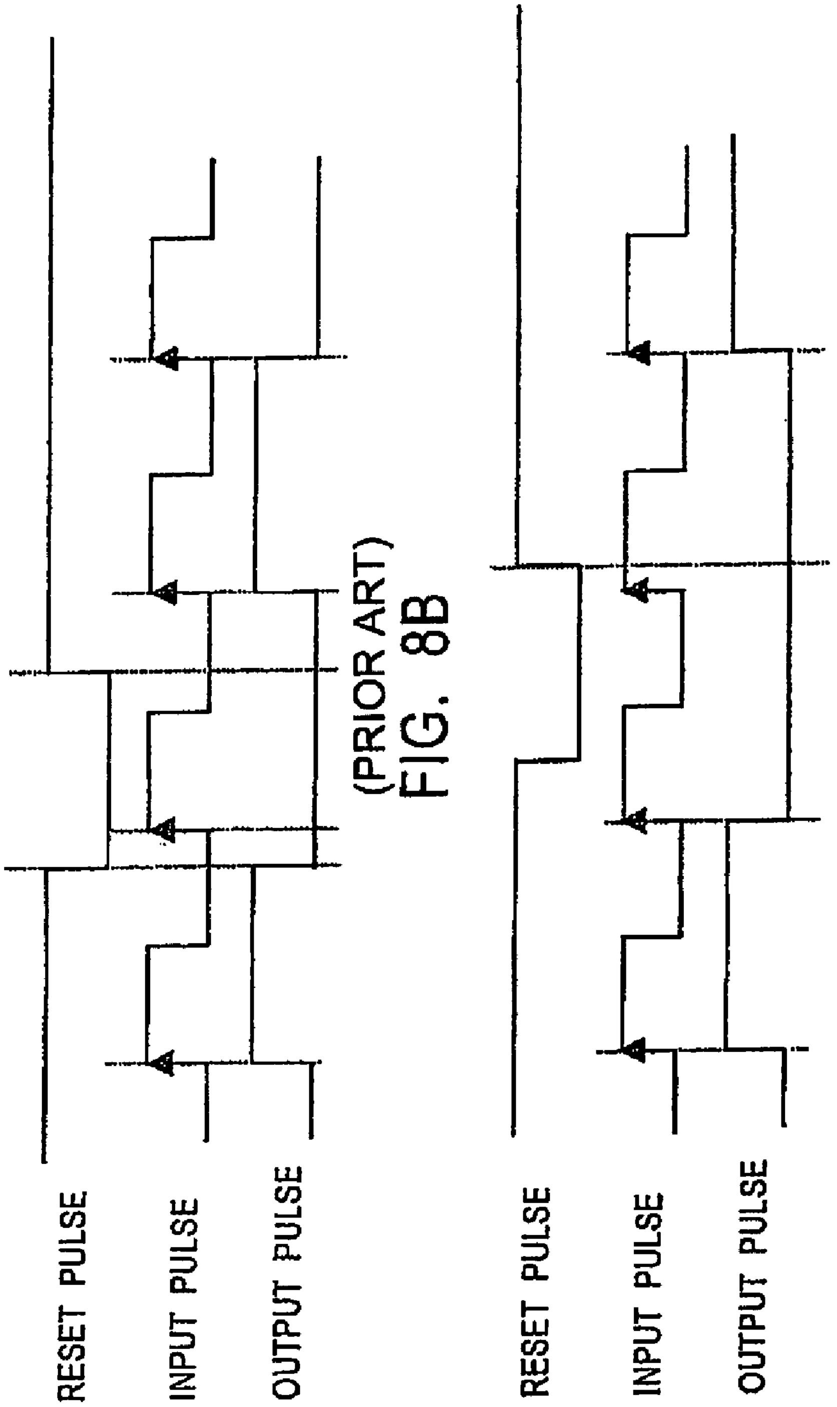
FIG. 8A (PRIOR ART)
FIGS. 8A and 8B are timing charts illustrating the circuit operation of a timing generation circuit according to a conventional example.

FIG. 6 is an exterior view showing the overview of the configuration of a portable terminal, for example, a PDA, according to the present invention.

The PDA according to this example has a folding configuration in which, for example, a lid 62 is provided so as to be openable and closable with respect to the main unit 61 of the device. On the top surface of the main unit 61 of the device, an operation section 63 on which various keys of a keyboard are arranged is placed. On the other hand, in the lid 62, a screen display section 64 is arranged. As this screen display section 64, a liquid-crystal display device in which the timing generation circuit according to the above-described embodiment is mounted as a timing generator on the same substrate as that of the display section is used.

By using the timing generation circuit according to the above-described embodiment as a timing generator of the liquid-crystal display device, a driving-circuit-integrated liquid-crystal display device having a large operation margin can be formed. As a result, by incorporating the liquid-crystal display device as the screen display section 64, the configuration of the entire PDA can be simplified, making it possible to contribute to a reduction in size and a reduction in cost.

Here, although a description has been given by using a case in which the present invention is applied to a PDA as an example, the present invention is not limited to this application example. The liquid-crystal display device according to the present invention is suitably used for, in particular, small and lightweight portable terminals in general, such as cellular phones.

INDUSTRIAL APPLICABILITY

As has thus been described, according to the present invention, in the timing generation circuit, which is formed on an insulating substrate and which has a plurality of flip-flops, for generating a plurality of timing signals whose frequencies are different in synchronization with a clock signal which is input external to the substrate, the plurality of flip-flops are divided into at least two systems and are reset separately at different timings. Thus, a resetting operation can be performed differently between a flip-flop which needs to be reset at an earlier timing and a flip-flop which needs to be reset at a timing which is delayed from the above. As a result, since the optimum reset timing can be set with respect to the respective flip-flops, a large operation margin can be ensured even when each circuit is formed by using transistors having large element characteristic variations and having a rough process rule.

The invention claimed is:

1. A logic circuit comprising:

a plurality of cascade-connected flip-flops, for generating a plurality of pulse signals whose frequencies are different, in synchronization with a clock signal which is input from external to the logic circuit; and a reset circuit that resets one or more of said flip-flops independently from remaining ones of said flip-flops, wherein said logic circuit is formed on or over an insulating substrate, and wherein a level-shift circuit is formed on said insulating substrate, and level-shifts the clock signal prior to the clock signal being input to the reset circuit.

2. The logic circuit according to claim 1, wherein said reset circuit takes the clock signal as an input, and generates separate reset signals at least partially based on the timing of the clock signal.

3. The logic circuit according to claim 1, wherein there are at least three flip-flops cascade-connected.

4. A timing generation circuit comprising:

a plurality of cascade-connected flip-flops, for generating a plurality of pulse signals whose frequencies are different, in synchronization with a clock signal; and a reset circuit that resets one or more of said flip-flops independently from remaining ones of said flip-flops, wherein said timing generation circuit is formed on or over an insulating substrate, and wherein a level-shift circuit is formed on said insulating substrate, and level-shifts the clock signal prior to the clock signal being input to the reset circuit.

5. The timing generation circuit according to claim 2, wherein said reset circuit takes the clock signal as an input, and generates separate reset signals at least partially based on the timing of the clock signal.

6. The timing generation circuit according to claim 2, wherein there are at least three flip-flops cascade-connected.

7. A timing circuit comprising:

a plurality of flip-flops, for generating a plurality of pulse signals whose frequencies are different, in synchronization with a clock signal; and a reset circuit that takes said clock signal as an input, and which independently resets each of said flip-flops, at different timings, at least partially based upon the timing of said clock signal, wherein said timing circuit is formed on or over an insulating substrate, and wherein a level-shift circuit is formed on said insulating substrate, and level-shifts the clock signal prior to the clock signal being input to the reset circuit.

8. The timing generation circuit according to claim 7, wherein there are at least three flip-flops cascade-connected.

* * * * *